(12) United States Patent
Kulkarni et al.

(10) Patent No.: US 7,952,912 B2
(45) Date of Patent: *May 31, 2011

(54) STATIC RANDOM ACCESS MEMORY CELL AND DEVICES USING SAME

(75) Inventors: Jaydeep P. Kulkarni, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 302 days.

This patent is subject to a terminal disclaimer.

(21) Appl. No.: 12/134,352

(22) Filed: Jun. 6, 2008

(65) Prior Publication Data

US 2009/0303775 A1 Dec. 10, 2009

(51) Int. Cl.
*G11C 11/00* (2006.01)
(52) U.S. Cl. .................. 365/154; 365/156; 365/207
(58) Field of Classification Search .............. 365/154, 365/156, 207, 230.05
See application file for complete search history.

(56) References Cited

U.S. PATENT DOCUMENTS

| | | | |
|---|---|---|---|
| 4,620,297 A | 10/1986 | Houston | |
| 5,796,659 A * | 8/1998 | Hegi | 365/189.03 |
| 6,744,661 B1 | 6/2004 | Shubat | |
| 6,775,178 B2 | 8/2004 | Liu et al. | |
| 6,975,532 B1 | 12/2005 | Kosonocky et al. | |
| 7,050,324 B2 | 5/2006 | Cummings et al. | |
| 7,177,177 B2 | 2/2007 | Chuang et al. | |
| 7,328,413 B2 | 2/2008 | Kim et al. | |
| 7,508,697 B1 | 3/2009 | Mukhopadhyay et al. | |
| 2002/0071305 A1 | 6/2002 | Lu et al. | |
| 2005/0276095 A1 | 12/2005 | Cummings et al. | |
| 2006/0102957 A1 | 5/2006 | Liaw | |
| 2006/0175606 A1 | 8/2006 | Wang et al. | |
| 2006/0212509 A1 | 9/2006 | Feigenbaum et al. | |
| 2006/0227595 A1 | 10/2006 | Chuang et al. | |
| 2007/0035986 A1 | 2/2007 | Houstonj | |
| 2007/0165447 A1 * | 7/2007 | Wagner et al. | 365/154 |
| 2007/0201262 A1 | 8/2007 | Joshi et al. | |
| 2007/0236985 A1 | 10/2007 | Edahiro et al. | |
| 2007/0279965 A1 | 12/2007 | Nakazato et al. | |

OTHER PUBLICATIONS

"Static Random Access Memory", From Wikipedia, the Free Encyclopedia, May 2008, 6 pages.
"Schmitt Trigger", From Wikipedia, the Free Encyclopedia, May 2008, 6 pages.
Ghosh et al., "Self-Calibration Technique for Reduction of Hold Failures in Low-Power Nano Scaled SRAM," Jul. 2006, 971-76.
Calhoun et al., "A 256kb Sub-Threshold SRAM in 65nm CMOS," IEEE Int'l Solid State Circuits Conf., Feb. 2006, 680-88.

* cited by examiner

*Primary Examiner* — Huan Hoang
(74) *Attorney, Agent, or Firm* — Barnes & Thornburg LLP

(57) ABSTRACT

A bit-cell may include a pair of cross-coupled inverters, a left bit-line, a right bit-line, a word-line and a write-line. The left bit-line may be coupled to a left inverter of the cross-coupled inverters via a left word-line transistor and a left write-line transistor. The right bit-line may be coupled to a right inverter of the cross-coupled inverters via a right word-line transistor and a right write-line transistor. The word-line may be coupled to the gates of the left and right word-line transistors and the write-line may be coupled to the gates of the left and right write-line transistors. A memory device may include a controller, an array of such bit-cells and a differential sensing buffers. Further, a computing device may include a processor and a memory device having the above bit-cells.

19 Claims, 7 Drawing Sheets

STATIC RANDOM ACCESS MEMORY CELL AND DEVICES USING SAME

Each technology generation attempts to shrink transistor dimensions in order to increase density and improve performance. However, shrinking the dimensions of transistors also tends to increase active power dissipation. As transistor dimensions have decreased, leakage power has become an increasingly more significant portion of total power dissipation. As a result, total power dissipation has become a significant design constraint in the present designs. The power consumption requirement in "mobile" devices such as cellphones, PDAs and medical devices is even more stringent for extending the battery operating lifetime.

Reducing the power supplied to the transistors has been found to have a significant effect on power savings. Particularly, reducing the supply voltage has been found to reduce the dynamic power quadratically and leakage power linearly to the first order. Hence, supply voltage scaling has remained a focus of low power design. For circuits requiring ultra low power dissipation, researchers have developed circuit techniques to operate circuits in the subthreshold regime.

As the supply voltage is reduced, the sensitivity of the circuit parameters to process variations increases. This sensitivity to circuit parameters limits circuit operation in the low voltage regime, particularly for SRAM cells such as the conventional six transistor (6T) bit cell shown in FIG. 7. These minimum geometry transistors are vulnerable to inter-die as well as intra-die process variations. Intra-die process variations include random dopant fluctuation (RDF), line edge roughness (LER) etc. Intra-die process variations may result in threshold voltage mismatch between adjacent transistors in a memory cell giving asymmetrical characteristics. The combined effect of reduced supply voltage along with increased process variations may lead to increased memory failures such as read failure, hold failure, access time failure and write failure.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
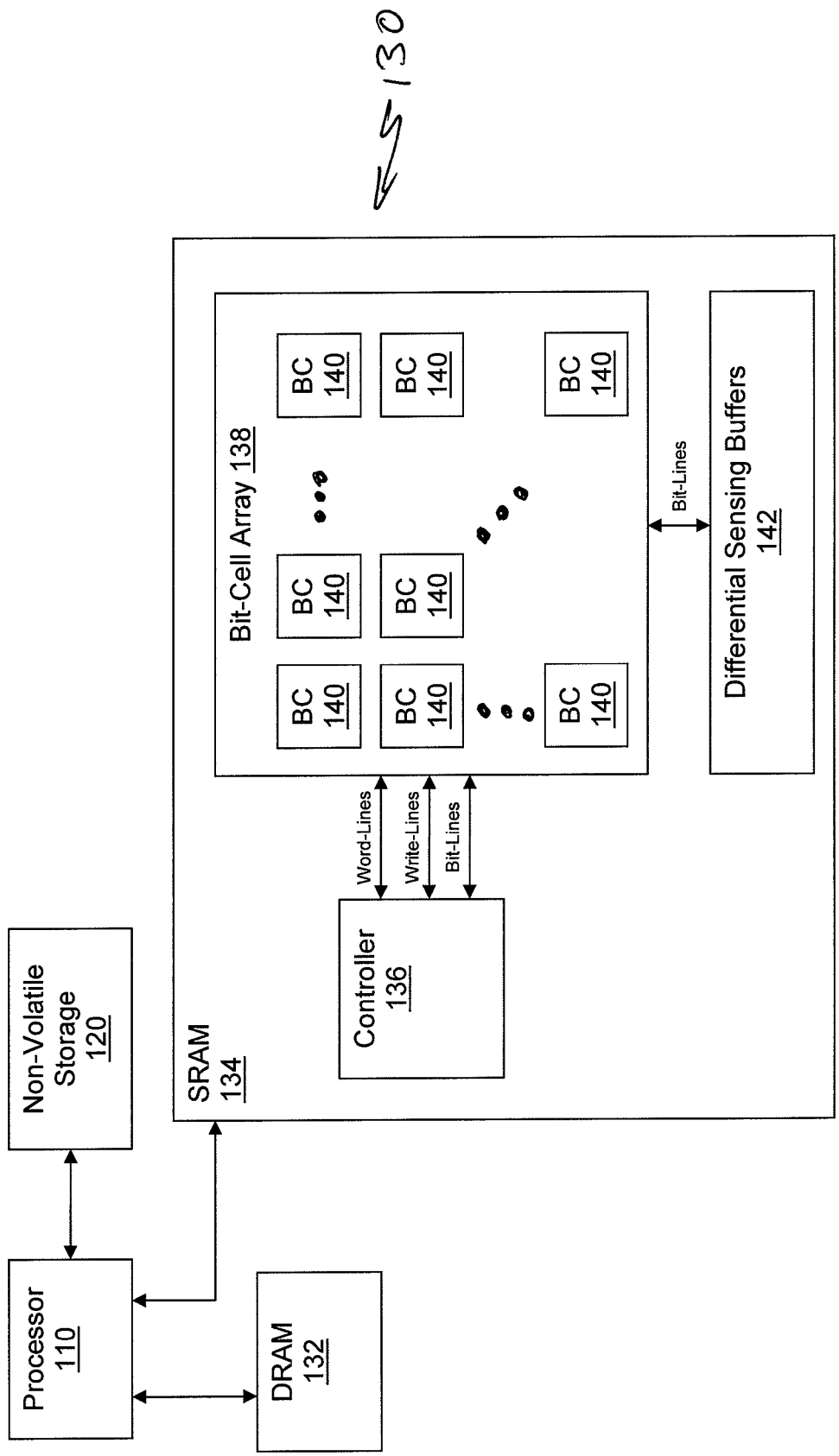
FIG. 1 shows an embodiment of a computing device having a static random access memory (SRAM).

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Moreover, the following description and claims use the terms "left" and "right" to succinctly and distinctly identify similar components. In particular, the term "left" is used to identify a component which is depicted in the drawings to the left of a similar component. Likewise, the term "right" is used to identify a component which is depicted in the drawings to the right of a similar component. However, it should be appreciated that the terms "left" and "right" in the following description and claims are used merely for convenience of description and are not meant to require a spatial relationship between such components. In other words, a left component of an embodiment may not be physically positioned to the left of a corresponding right component and a right component may not be physically positioned to the right of a corresponding left component. Further, a left component is not required to be physically positioned toward the left of an embodiment incorporating the left component, nor is a right component required to be physically positioned toward the right of an embodiment incorporating the right component.

Referring now to FIG. 1, a computing device 100 is shown that comprises a processor 110 and a non-volatile storage 120. The non-volatile storage 120 may include NOR flash memory, NAND flash memory, read only memory, a solid state drive (SSD), a hard disk drive, and/or optical media and corresponding drive such as a DVD, CD, BlueRay disc and corresponding drive. The non-volatile storage 120 may store, in a persistent manner, instructions to be executed by the processor 110 and data to be processed by the processor 110. As shown, the processor 110 may further include volatile storage 130 such a dynamic random access memory (DRAM) 132 and static random access memory (SRAM) 134. The volatile storage 130 may store, in a non-persistent manner, instructions to be executed by the processor 110 and data to be processed by the processor 110. While the embodiment depicted in FIG. 1 shows the non-volatile storage 120, DRAM 132 and SRAM 134 external to the processor 110, all or a portion of non-volatile storage 120, the DRAM 132 and/or SRAM 134 may be internal to the processor 110 in other embodiments of the computing device 100.

The computing device 100 may be implemented using a number of different form factors. For example, the computing device 100 may be implemented as a mobile phone, a laptop computer, a notebook computer, a mini-notebook computer or netbook, a personal data assistant, a medical device, and/or other computing platform.

As shown, the SRAM 134 may include a controller 136 and an array 138 of bit-cells 140 wherein each bit-cell 140 may store a single bit having either (a) a logical low or '0' value, or (b) a logical high or '1' value and may provide a differential data signal indicative of the stored bit to a differential sensing buffer 142. The differential sensing buffers 142 may sense the differential data signals and generate conditioned single ended, differential, or other data output signals indicative of the sensed differential data signals.

The bit-cells 140 of the array 138 may be grouped into addressable units or words (e.g. 8 bit-cells, 16 bit-cells, etc.) to permit storing and retrieving words via a single write or read operation. Moreover, each bit-cell 140 in one embodiment comprises two bit-lines BL, BR (shown in FIG. 2) that provide a differential data signal to a corresponding differential sensing buffer 142 of the SRAM 134. For example, in one embodiment, the bit-cell 140 may impress a low voltage or logical '0' value on the bit-line BR and may impress a high voltage or logical '1' value on the bit-line BL to indicate a stored logical '0' value. Conversely, the bit-cell 140 may impress a high voltage or logical '1' value on the bit-line BR and may impress a low voltage or logical '0' value on the bit-line BL to indicate a stored logical '1' value.

Figure 2:
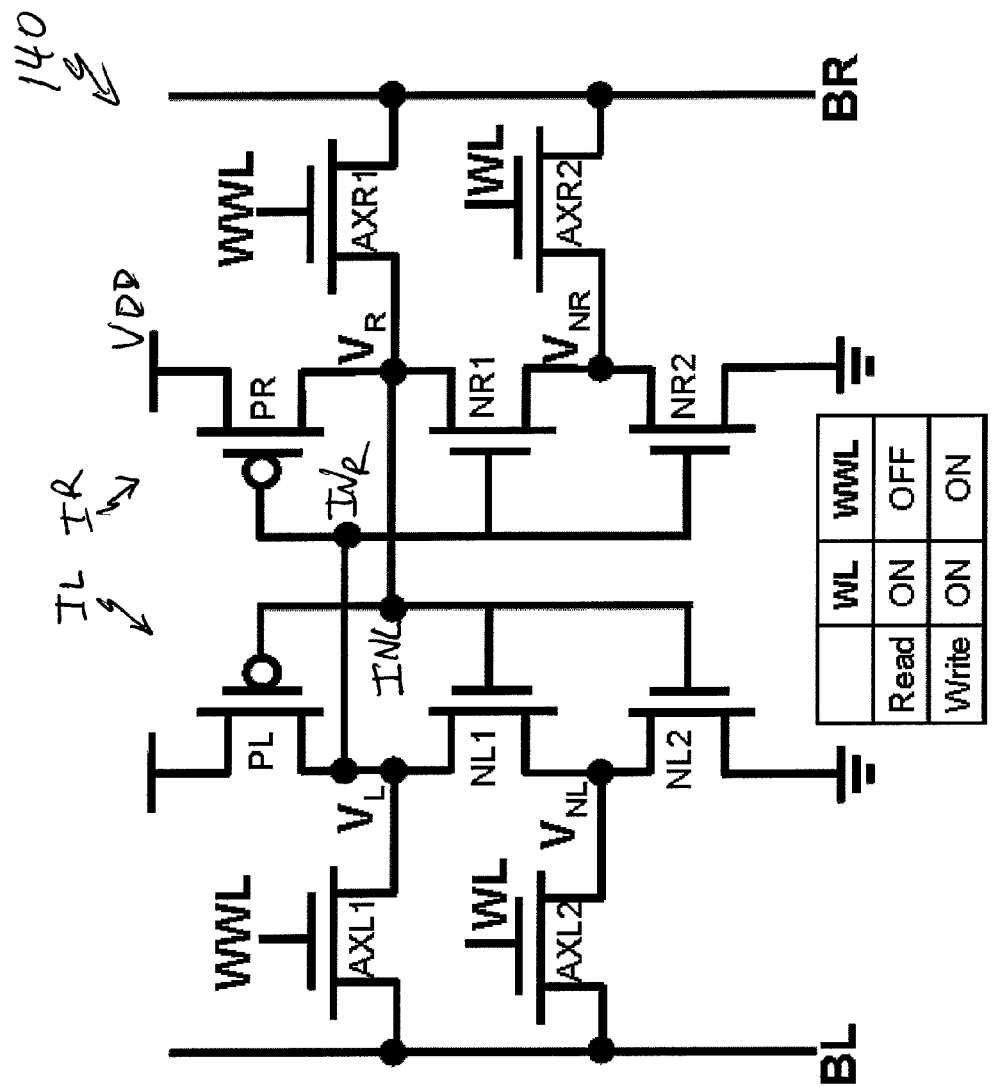
FIG. 2 shows an embodiment of a bit-cell of the SRAM shown in FIG. 1.

The controller 136, based upon received address signals and possibly other control signals (e.g. chip enable CE, write enable WE, write output WO), may read from or write to a group of bit-cells 140 associated with an address indicated by the received address signals. To this end, as shown in FIG. 2, each bit-cell 140 of a word includes a word-line WL, a write-line WWL and two bit-lines BL, BR. In one embodiment, the word-lines WL, and write-lines WWL of each bit-cell 140 are shared among the bit-cells 140 of a word, whereas the two bit-lines BL, BR are distinct among each bit-cell 140 of the word. The controller 136 may selectively activate the word-lines WL, and the write-lines WWL to select a particular word of the SRAM 134 and may use the bit-lines BL, BR of a bit-cell 140 to supply data to the bit-cells 140 or receive data from bit-cells 140 as explained in more detail below.

As shown in FIG. 2, a bit-cell 140 comprises two cross coupled inverters IL, IR in which the input of the left IL is coupled to the output of the right IR and the input of the right IR is coupled to the input of the left inverter IL. As shown, PMOS transistor PL, and NMOS transistors NL1, NL2 are connected in series between a supply voltage VDD and ground to which form the left inverter IL. Likewise, PMOS transistor PR, and NMOS transistors NR1, NR2 are connected in series between the supply voltage VDD and ground to which form the right inverter IL.

Mores specifically, the drain of the left pull-up transistor PL is coupled to a high voltage source VDD and the source of the left pull-up transistor PL is coupled to the drain of the left pull-down transistor NL1 at a left storage node $V_L$. Further, the source of the left pull-down transistor NL2 is coupled to ground and the drain of the left pull-down transistor NL2 is coupled to the source of the left pull-down transistor NL1 at a left biasing node $V_{NL}$. The gates of the transistors PL, NL1, NL2 are coupled together at node $IN_L$ to form an input to the left inverter IL and the output of the left inverter IL corresponds to the left storage node $V_L$.

Similarly, the drain of the right pull-up transistor PR is coupled to the high voltage source VDD and the source of the right pull-up transistor PR is coupled to the drain of the right pull-down transistor NR1 at a right storage node $V_R$. Further, the source of the right pull-down transistor NR2 is coupled to ground and the drain of the right pull-down transistor NR2 is coupled to the source of the transistor NR1 at a right biasing node $V_{NR}$. The gates of the transistors PR, NR1, NR2 are coupled together at a node $IN_R$ to form an input to the right inverter IR and the output of the right inverter IR corresponds to the right storage node $V_R$. Moreover, the right input node $IN_R$ of the right inverter IR is coupled to the output node $V_L$ of the left inverter IL and the left input node $IN_L$ of the left inverter IL is coupled to the output node $V_R$ of the right inverter IR in order to cross couple the two inverters IL, IR.

The bit-cell 140 further includes two NMOS transistors AXL1, AXR1 which the controller 136 activates or turns-on during a write operation and two NMOS transistors AXL2, AXR2 which the controller 136 activates or turns-on during read operations and write operations. More specifically, the left write-line transistor AXL1 is coupled between the left bit-line BL and the left storage node $V_L$ of the left inverter IL, and the right write-line transistor AXR1 is coupled between the right bit-line BR and the right storage node $V_R$ of the right inverter IR. Moreover, the gates of the write-line transistors AXL1, AXR1 are coupled to the write-line WWL. Similarly, the left word-line transistor AXL2 is coupled between the left bit-line BL and the left biasing node $V_{NL}$ of the left inverter IL, and the right word-line feed-back transistor AXR2 is coupled between the right bit-line BR and the right biasing node $V_{NR}$ of the right inverter IR. Furthermore, the gates of the word-line transistors AXL2, AXR2 are coupled to the word-line WL.

During a hold operation for a word of the SRAM 134, the controller 136 disables or de-asserts both the write-line WWL and the word-line WL, thus disconnecting or decoupling the storage nodes $V_L$, $V_R$ and the biasing nodes $V_{NL}$, $V_{NR}$ from the bit-lines BR, BL. As a result, the cross coupled inverters IL, IR reinforce each other. In particular, if the output node $V_R$ of the right inverter IR is a logical '1' value, then the left input node $IN_L$ of the left inverter IL is a logical '1' value which turns-off the transistor PL and turns-on the transistors NL1, NL2. Accordingly, the left output node $V_L$ is pulled down to ground resulting in a logical '0' value for the left inverter IL. The logical '0' value of the left output node $V_L$ in turn is applied to the right input node $IN_R$ of the right inverter IL. The logical '0' value of the right input node INR turns-on the transistor PR and turns-off the transistors NR1, NR2 which pulls the right output node $V_R$ up to the supply voltage VDD, resulting in a logical '1' value for the right inverter IR. As can be appreciated from the above, the cross coupled inverters IL, IR reinforce each other, thus maintaining a stored state.

Figure 3:
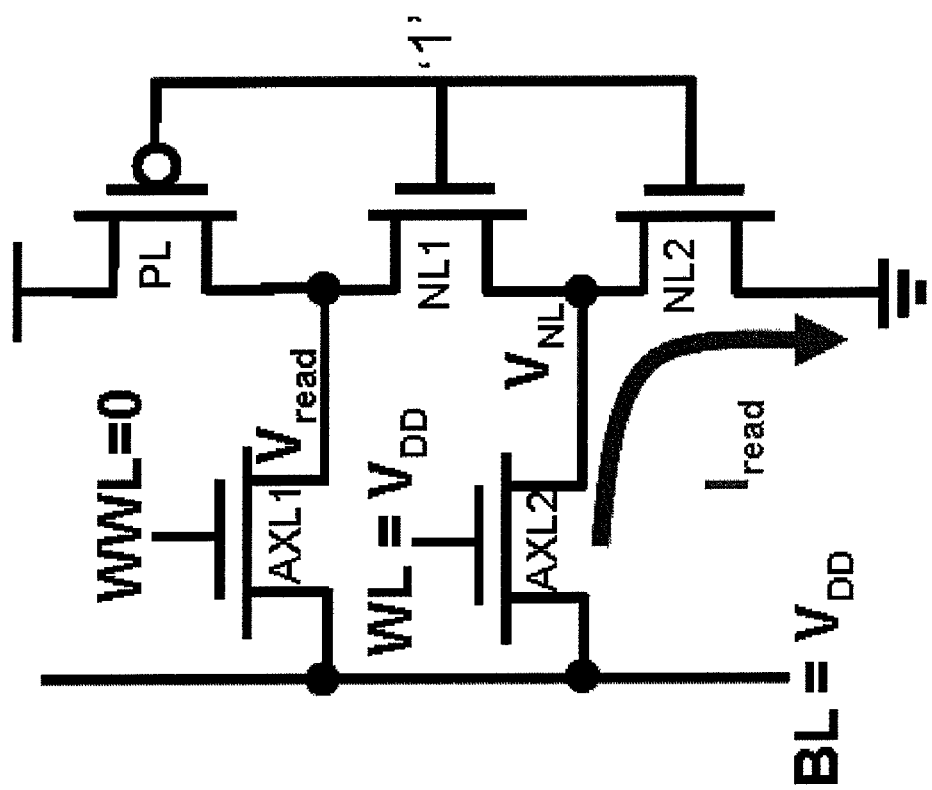
FIG. 3 shows operation of the bit-cell of FIG. 2 during a read.

Referring now to FIGS. 2 and 3, the following description of a read operation assumes the left storage node $V_L$ stores a logical '0' value and the right storage node $V_R$ stores a logical '1' value. However, one skilled in the art may easily discern from the following description the converse read operation of the bit-cell 140 where the left storage node $V_L$ stores a logical '1' value and the right storage node $V_R$ stores a logical '0' value.

To perform a read operation of a word of the SRAM 134, the controller 136 may precharge the corresponding bit-lines BL, BR to the supply voltage VDD, may assert or enable the corresponding common word-line WL and may de-assert or disable the corresponding write-line WWL. In one embodiment, asserting or enabling corresponds to a logical '1' value and de-asserting or disabling corresponds to a logical '0' value. However, depending upon a given implementation a logical '0' value and a logical '1' value may correspond to various circuit conditions. For example, a logical '0' value may correspond to a low voltage, a high voltage, a negative differential voltage, or a positive differential voltage in which case a logical '1' value may respectively correspond to a high voltage, a low voltage, a positive differential voltage, or a negative differential voltage. Other encodings of a logical '0' value and a logical '1' value are also possible and contemplated.

As a result of asserting the word-line WL and de-asserting the write-line WWL, the word-line transistors AXL2, AXR2 are turned-on and the write-line transistors AXL1, AXL2 are turned-off. In which case, the precharged left bit-line BL raises the left biasing node $V_{NL}$ above the ground to a read voltage $V_{READ}$ as the precharged left bit-line BL is pulled down to ground via the left word-line transistor AXL2 and the left pull-down transistor NL2 of the left inverter IL.

Since the write-line WWL has turned-off the left write-line transistor AXL1, no current flows through the left write-line transistor AXL1 and the left storage node $V_L$ is substantially equal to the left biasing node $V_{NL}$ or the read voltage $V_{READ}$. If the read voltage $V_{READ}$ is higher than the switching threshold of the right inverter IR, the stored bit of the bit-cell 140 may flip resulting in a read failure event.

In order to combat such a read failure event, the precharged right bit-line BR raises the voltage of the right biasing node $V_{NR}$ to approximately the source voltage VDD, thus resulting in a negative gate-to-source voltage $V_{GS}$ for the transistor NR2. The negative gate-to-source voltage $V_{GS}$ raises the switching threshold voltage for the right inverter IR. Accordingly, the word-line WL raises the switching threshold of whichever inverter IL, IR currently stores a logical '1' value to prevent or resist flipping the stored logical '1' value due to the precharged bit-lines BL, BR momentarily raising the output voltage $V_L$, $V_R$ of the inverter IL, IR storing the logical '0' value.

Figure 6:
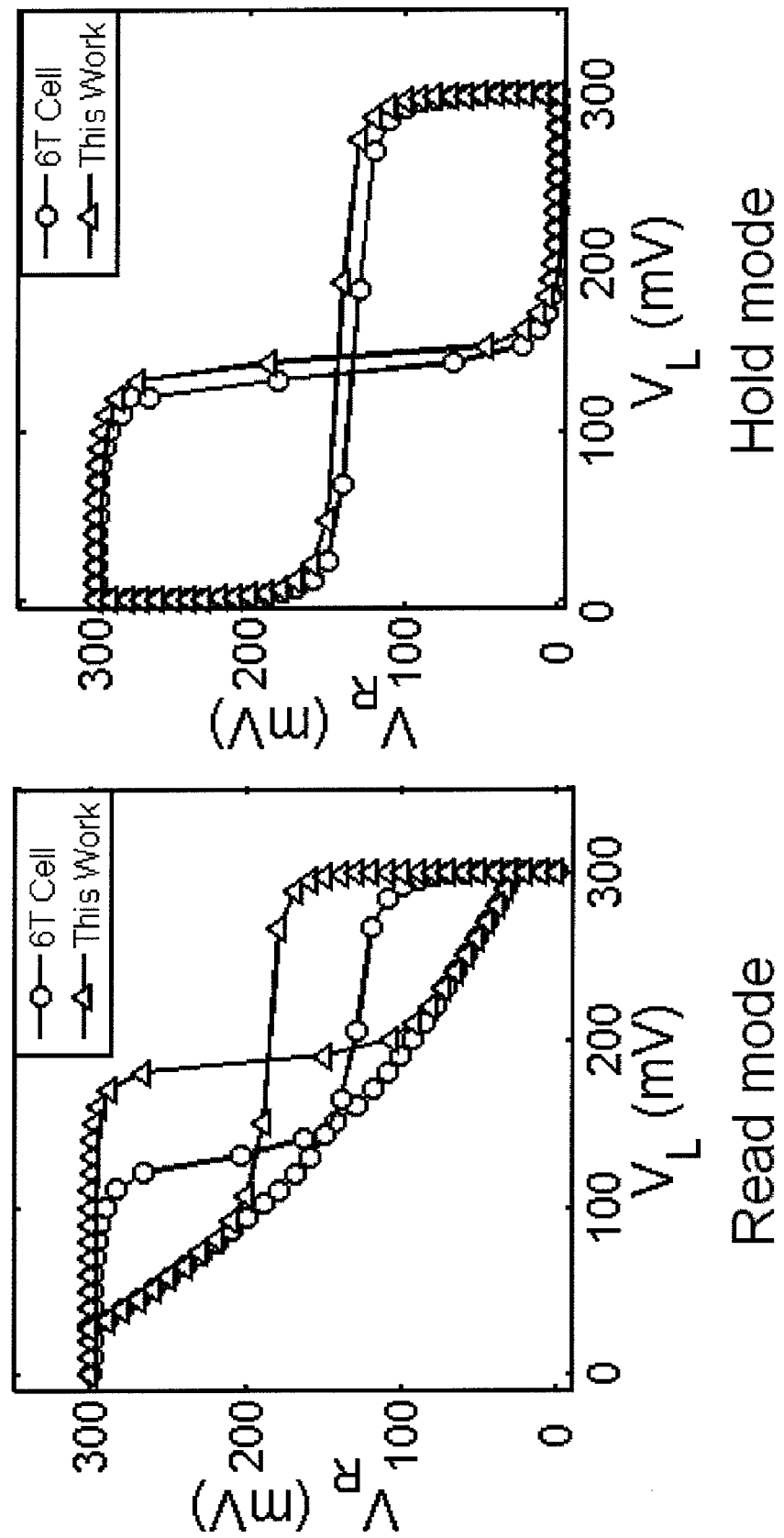
FIG. 6 compares performance of the bit-cell of FIG. 2 to a convention six transistor (6T) bit-cell for an SRAM.

Compared to a conventional six transistor (6T) bit-cell, FIG. 6 shows that the bit-cell 140 has improved read static noise margin (SNM). Furthermore, FIG. 6 shows that hold SNM of the bit-cell 140 is marginally increased compared to the 6T cell. The word-line transistors AXL2, AXR2 may track the pull-down transistors NL2, NR2 variations across the process corners giving improved process variation tolerance. Furthermore, the storage nodes $V_L$, $V_R$ are isolated from the read current path as shown in FIG. 3 which results in reduced capacitive coupling from the switching common word-line WL.

Figure 4:
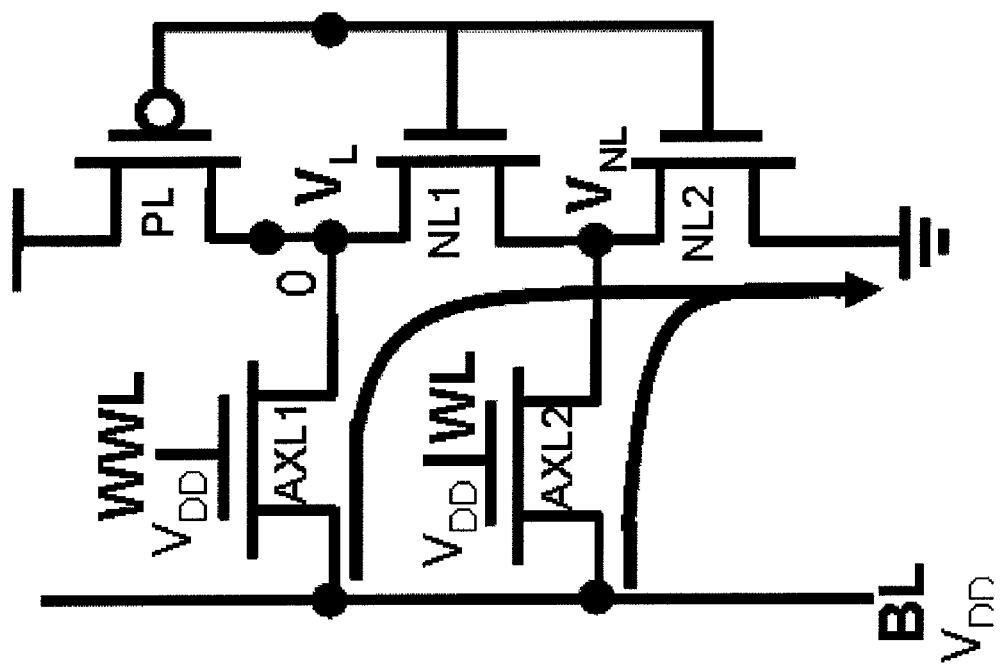
FIG. 4 shows operation of the left side of the bit-cell of FIG. 2 during an illustrative write.
Figure 5:
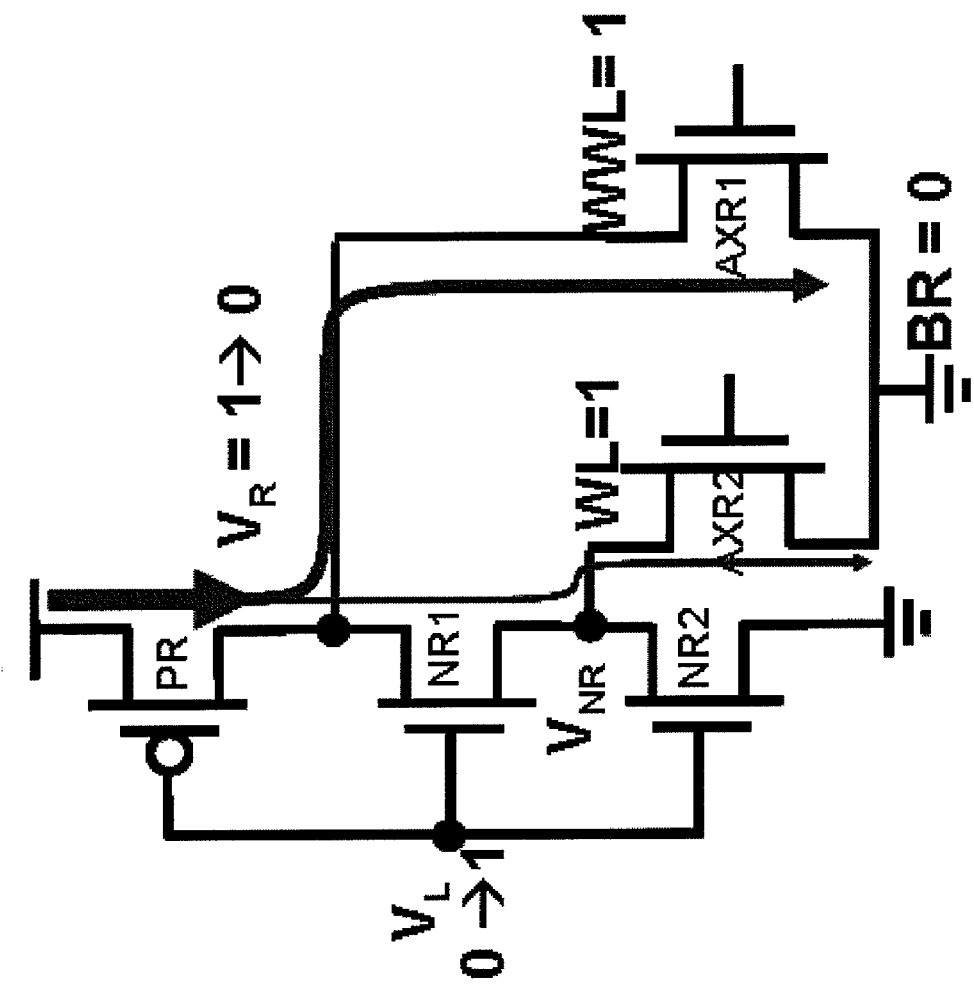
FIG. 5 shows operation of the right side of the bit-cell of FIG. 2 during an illustrative write.

Referring now to FIGS. 2, 4 and 5, the following description of a write operation assumes the left storage node $V_L$ stores a logical '0' value and the right storage node $V_R$ stores a logical '1' value. However, one skilled in the art may easily discern from the following description the converse write operation of bit-cell 140 where the left storage node $V_L$ stores a logical '1' value and the right storage node $V_R$ stores a logical '0' value.

Figure 7:
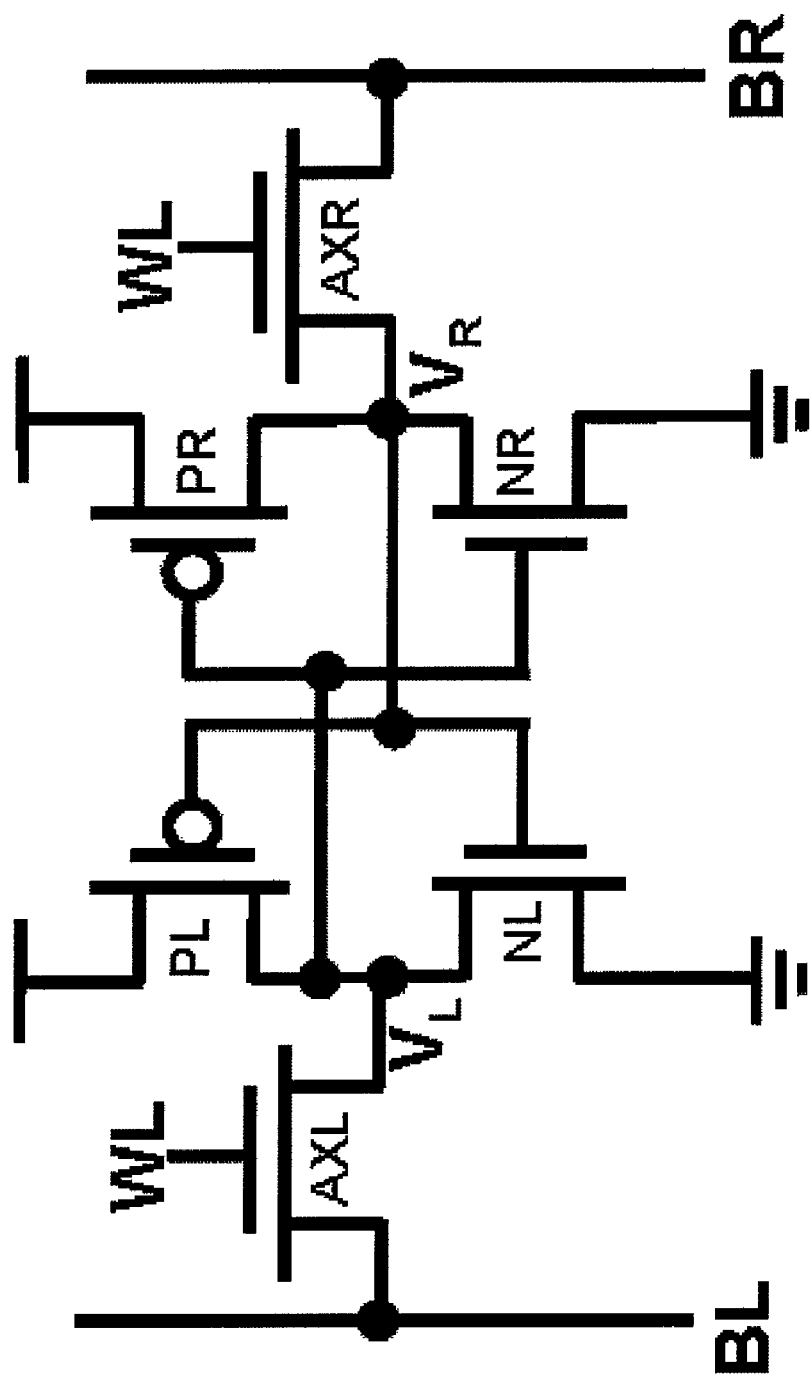
FIG. 7 shows a conventional 6T bit-cell.

To perform a write operation of a word of the SRAM 134, the controller 136 may pull the right bit-line BR to ground or a logical '0' value, may charge the left bit-line BL to the supply voltage VDD or a logical '1' value, may assert or enable the corresponding word-line WL and may assert or enable the corresponding write-line WWL. As a result of asserting the word-line WL and asserting the write-line WWL, the word-line transistors AXL2, AXR2 are turned-on and the write-line transistors AXL1, AXR1 are turned-on. As a result of being turned-on, the right write-line and word-line transistors AXR1, AXR2 both provide a discharge path for the right storage node $V_R$ to the grounded right bit-line BR as shown in FIG. 5. The conventional 6T bit-cell of FIG. 7 only has a single transistor pull-down path. As a result, the bit-cell 140 provides a stronger pull-down path than the conventional 6T bit-cell. Furthermore, the left write-line and word-line transistors AXL1, AXL2 both force current through the left pull-down transistor NL2 as shown in FIG. 4. The increased current through the left pull-down transistor NL2 increases the voltage at the left storage node $V_L$ to be higher than the read mode voltage $V_{READ}$. The combined effect of the additional pull-down path for the right storage node $V_R$ and the increased voltage at the left storage node $V_L$ results in a higher write-trip-point in the bit-cell 140 compared to the convention 6T bit-cell.

While the disclosure has been illustrated and described in detail in the drawings and foregoing description, such an illustration and description is to be considered as merely illustrative and not restrictive in character, it being understood that only illustrative embodiments have been shown and described and that all changes and modifications that come within the spirit of the disclosure are desired to be protected.

What is claimed is:

1. A bit-cell comprising
a pair of cross-coupled inverters in which a left inverter has an output coupled to an input of a right inverter and the right inverter has an output coupled to an input of the left inverter, the left inverter to store a left value at the output of the left inverter and the right inverter to store a right value at the output of the right inverter,
a left word-line transistor coupled between a left bit-line and the left inverter, and
a word-line coupled to a gate of the left word-line transistor, the word-line to turn-on the left word-line transistor to dynamically raise a switching threshold of the left inverter during a read operation only when the left value is a high value and the right value is a low value.

2. The bit-cell of claim 1, further comprising a right word-line transistor coupled between a right bit-line and the right inverter, wherein the word-line is further coupled to a gate of the right word-line transistor to turn-on the right word-line transistor during a read operation.

3. The bit-cell of claim 1, wherein
the left inverter comprises a pull-up transistor and two pull-down transistors, the pull-up transistor coupled between the output of the left inverter and a supply voltage and the two pull-down transistors coupled in series between the output of the left inverter and ground, and
the left word-line transistor is coupled to the left inverter at a biasing node between the two pull-down transistors.

4. The bit-cell of claim 1, further comprising a right word-line transistor, wherein
the left inverter comprises a left pull-up transistor and two left pull-down transistors, the left pull-up transistor coupled between the output of the left inverter and a supply voltage and the two left pull-down transistors coupled in series between the output of the left inverter and ground,
the left word-line transistor is coupled to the left inverter at a left biasing node between the two left pull-down transistors,
the right inverter comprises a right pull-up transistor and two right pull-down transistors, the right pull-up transistor coupled between the output of the right inverter and the supply voltage and the two right pull-down transistors coupled in series between the output of the right inverter and ground,
the right word-line transistor is coupled between a right bit-line and the right inverter at a right biasing node between the two right pull-down transistors, and
the word-line is further coupled to a gate of the right word-line transistor to turn-on the right word-line transistor during a read operation.

5. The bit-cell of claim 1, further comprising
a right word-line transistor coupled between a right bit-line and the right inverter and a gate of the right word-line transistor coupled to the word-line,
a left write-line transistor coupled between the left bit-line and the output of the left inverter,
a right write-line transistor coupled between the right bit-line and the output of the right inverter,
a write-line coupled to a gate of the left write-line transistor and a gate of the right write-line transistor to turn-on the left write-line transistor and the right write-line transistor during a write operation.

6. The bit-cell of claim 1, further comprising
a left write-line transistor coupled between the left bit-line and the output of the left inverter,
a write-line coupled to a gate of the left write-line transistor,
wherein, during a write operation, the word-line is to turn-on the left word-line transistor, the write-line is to turn-on the left write-line transistor, and the left word-line transistor and the left write-line transistor each provide a pull-down path when changing the left value of the left inverter from a high value to a low value.

7. A memory device, comprising a controller and a plurality of bit-cells coupled to the controller via a plurality of differential bit-lines and a plurality of word-lines, each bit-cell of the plurality of bit-cells comprising
a pair of cross-coupled inverters in which a left inverter has an output coupled to an input of a right inverter and the right inverter has an output coupled to an input of the left inverter, the left inverter to store a left value at the output of the left inverter and the right inverter to store a right value at the output of the right inverter,
a left word-line transistor coupled between the left inverter and a left bit-line of a differential bit-line of the plurality of bit-lines, a right word-line transistor coupled between the right inverter and a right bit-line of the differential bit-line,
a word-line of the plurality of word-lines coupled to a gate of the left word-line transistor and a gate of the right word-line transistor, wherein
in response to a read operation of a word associated with the word-line, the controller is to turn-on the left word-line transistor and the right word-line transistor which raise a switching threshold of at least one inverter of the pair of cross-coupled inverters.

8. The memory device of claim 7, further comprising a plurality of differential sensing buffers coupled to the plurality of bit-cells via the plurality of differential bit-lines, each differential sensing buffer to sense a differential data signal received via a differential bit-line of the plurality of differential bit-lines and generate an output signal indicative of the sensed differential data signal.

9. The memory device of claim 7, wherein
the left inverter comprises a pull-up transistor and two pull-down transistors, the pull-up transistor coupled between the output of the left inverter and a supply voltage and the two pull-down transistors coupled in series between the output of the left inverter and ground, and
the left word-line transistor is coupled to the left inverter at a biasing node between the two pull-down transistors.

10. The memory device of claim 7, wherein
the left inverter comprises a left pull-up transistor and two left pull-down transistors, the left pull-up transistor coupled between the output of the left inverter and a supply voltage and the two left pull-down transistors coupled in series between the output of the left inverter and ground,
the left word-line transistor is coupled to the left inverter at a left biasing node between the two left pull-down transistors,
the right inverter comprises a right pull-up transistor and two right pull-down transistor, the right pull-up transistor coupled between the output of the right inverter and the supply voltage and the two right pull-down transistors coupled in series between the output of the right inverter and ground.

11. The memory device of claim 7, wherein
the controller is further coupled to the plurality of bit-cells via a plurality of write-lines,
each bit-cell of the plurality of bit-cells further comprises
a left write-line transistor coupled between the left bit-line and the output of the left inverter,
a right write-line transistor coupled between the right bit-line and the output of the right inverter,
a write-line of the plurality of write-lines coupled to a gate of the left write-line transistor and a gate of the right write-line transistor, and
in response to a write operation, the controller is to activate the write-line to turn-on the left write-line transistor and the right write-line transistor.

12. The memory device of claim 7, wherein
the controller is further coupled to the plurality of bit-cells via a plurality of write-lines, and
each bit-cell of the plurality of bit-cells further comprises
a left write-line transistor coupled between the left bit-line and the output of the left inverter,
a right write-line transistor coupled between the right bit-line and the output of the right inverter,
a write-line of the plurality of write-lines coupled to a gate of the left write-line transistor and a gate of the right write-line transistor, and
in response to a write operation, the controller is to activate the word-line to turn-on the left word-line transistor and right word-line transistor and to activate the write-line to turn-on the left write-line transistor and the right write-line transistor, wherein the left word-line transistor and the left write-line transistor each provides a pull-down path when changing the left value of the left transistor from a high value to a low value.

13. A computing device, comprising
a processor to execute instructions,
a controller, and
a plurality of bit-cells to store instruction, the plurality of bit-cells coupled to the controller, wherein
a bit-cell of the plurality of bit-cells comprises a pair of cross-coupled inverters in which a left inverter has an output coupled to an input of a right inverter and the right inverter has an output coupled to an input of the left inverter, a left word-line transistor coupled between a left bit-line and the left inverter at a left biasing node of the left inverter, a left write-line transistor coupled between a left bit-line and the left inverter at the output of the left inverter, a word-line coupled to a gate of the left word-line transistor, and a write-line coupled to a gate of the left write-line transistor,
in response to a read operation involving the bit-cell, the controller is to activate the word-line to turn-on the left word-line transistor and to de-activate the write-line to turn-off the left write-line transistor, and
in response to a write operation involving the bit-cell, the controller is to activate the word-line to turn-on the left word-line transistor and to activate the write-line to turn-on the left write-line transistor.

14. The computing device of claim 13, wherein the left word-line transistor raises a switching threshold of the left inverter during the read operation.

15. The computing device of claim 14, wherein the bit-cell further comprises a right word-line transistor coupled between a right bit-line and the right inverter and a gate of the right word-line transistor is coupled to the word-line.

16. The computing device of claim 14, wherein
the left inverter comprises a pull-up transistor and two pull-down transistor, the pull-up transistor coupled between the output of the left inverter and a supply voltage and the two pull-down transistors coupled in series between the output of the left inverter and ground, and the left word-line transistor is coupled to the left inverter at a biasing node between the two pull-down transistors.

17. The computing device of claim 14, wherein the bit-cell further comprises a right word-line transistor, the left inverter comprises a left pull-up transistor and two left pull-down transistors, the left pull-up transistor coupled between the output of the left inverter and a supply voltage and the two left pull-down transistors coupled in series between the output of the left inverter and ground, the left word-line transistor is coupled to the left inverter at a left biasing node between the two left pull-down transistors, the right inverter comprises a right pull-up transistor and two right pull-down transistors, the right pull-up transistor coupled between the output of the right inverter and the supply voltage and the two right pull-down transistors coupled in series between the output of the right inverter and ground, and the right word-line transistor is coupled between a right bit-line and the right inverter at a right biasing node between the two right pull-down transistors and a gate of the right word-line transistor is coupled to the word-line.

18. The computing device of claim 14, wherein the bit-cell further comprises a right word-line transistor coupled between a right bit-line and the right inverter and a gate of the right word-line transistor coupled to the word-line, and a right write-line transistor coupled between the right bit-line and the output of the right inverter and a gate of the right write-line transistor coupled to the write-line.

19. The computing device of claim 14, wherein the left write-line transistor and the left word-line transistor each provide a pull-down path when changing the left value of the left transistor from a high value to a low value.

* * * * *